(12) United States Patent
Chai et al.

(10) Patent No.: US 7,851,261 B2
(45) Date of Patent: Dec. 14, 2010

(54) SEMICONDUCTOR PACKAGE AND METHOD OF ASSEMBLING THE SAME

(75) Inventors: Fui Jin Chai, Singapore (SG); Hai Guan Loh, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 212 days.

(21) Appl. No.: 11/761,119

(22) Filed: Jun. 11, 2007

(65) Prior Publication Data

US 2007/0287228 A1 Dec. 13, 2007

Related U.S. Application Data

(63) Continuation of application No. PCT/IB2004/004046, filed on Dec. 9, 2004.

(51) Int. Cl.
*H01L 21/00* (2006.01)
(52) U.S. Cl. ............... 438/109; 257/686; 257/E25.013
(58) Field of Classification Search ................. 438/109
See application file for complete search history.

(56) References Cited

U.S. PATENT DOCUMENTS

| 686,128 | A | * | 11/1901 | Proudfit ................... 16/108 |
| 4,246,438 | A | | 1/1981 | Gozlan |
| 4,469,014 | A | | 9/1984 | Nelson |
| 5,291,061 | A | * | 3/1994 | Ball ......................... 257/686 |
| 5,323,060 | A | * | 6/1994 | Fogal et al. .............. 257/777 |
| 6,333,562 | B1 | * | 12/2001 | Lin ........................... 257/777 |
| 6,531,784 | B1 | | 3/2003 | Shim et al. |
| 6,552,416 | B1 | | 4/2003 | Foster |
| 6,555,902 | B2 | * | 4/2003 | Lo et al. .................. 257/686 |
| 6,593,662 | B1 | * | 7/2003 | Pu et al. ................... 257/777 |
| 6,621,155 | B1 | | 9/2003 | Perino et al. |
| 6,930,378 | B1 | * | 8/2005 | St. Amand et al. ...... 257/686 |
| 6,930,396 | B2 | * | 8/2005 | Kurita et al. ............. 257/777 |
| 6,933,172 | B2 | * | 8/2005 | Tomimatsu ............... 438/109 |
| 6,933,597 | B1 | * | 8/2005 | Poddar et al. ........... 257/686 |
| 6,946,328 | B2 | * | 9/2005 | Kim et al. ................ 438/114 |
| 7,033,911 | B2 | * | 4/2006 | Manepalli et al. ....... 438/455 |
| 7,163,839 | B2 | * | 1/2007 | Yan et al. ................. 438/106 |
| 7,269,897 | B2 | * | 9/2007 | Frezza ....................... 29/832 |
| 7,276,790 | B2 | * | 10/2007 | Seng ........................ 257/724 |
| 7,422,930 | B2 | * | 9/2008 | Thomas et al. .......... 438/109 |
| 7,443,037 | B2 | * | 10/2008 | Kim et al. ................ 257/777 |
| 2001/0015454 | A1 | | 8/2001 | Lee et al. |
| 2003/0038357 | A1 | | 2/2003 | Derderian |
| 2003/0160312 | A1 | | 8/2003 | Lo et al. |

* cited by examiner

*Primary Examiner*—David A Zarneke
(74) *Attorney, Agent, or Firm*—Edell, Shapiro & Finnan, LLC

(57) ABSTRACT

An encapsulated semiconductor package includes a substrate including a chip mounting area and inner contact pads on its upper surface and at least two semiconductor chips, each having an active surface with a plurality of chip contact pads and a passive surface. A first semiconductor chip is mounted on the chip mounting area. A spacer block including a first and a second mounting face lying in essentially parallel planes is positioned between and attached to the first semiconductor chip and a second semiconductor chip. The mounting faces of the spacer block have a rounded outline.

11 Claims, 6 Drawing Sheets

SEMICONDUCTOR PACKAGE AND METHOD OF ASSEMBLING THE SAME

CROSS REFERENCE TO RELATED APPLICATIONS

This application is a continuation of International Application No. PCT/IB2004/004046, filed on Dec. 9, 2004, entitled "Semiconductor Package and Method of Assembling the Semiconductor Package," the entire contents of which are hereby incorporated by reference.

BACKGROUND

Semiconductor chips and their electrical connections, such as bond wires or solder bumps, are frequently encapsulated in a plastic material in order to protect the components from mechanical and environmental damage, in particular, from moisture.

In order to save time and manufacturing costs, several packages are often encapsulated in a single plastic mass by placing the packages in a mold and injecting the plastic material into the mold. This method is associated with the problem of the poor distribution of the plastic mold material throughout the mold which can lead to the formation of voids in the encapsulation of the package. This is found to be a particular problem for packages situated in the portion of the mold furthest from the inlet point. Void formation in the plastic encapsulation mass has also been found to be a problem in stacked semiconductor packages where voids have been observed to form adjacent to the side of the spacer block which faces away from the inlet point.

Various approaches have been used to try to minimize this problem. The properties of the mold material, for example, its viscosity and the particle size of the filler, have been altered and the number of rows of packages encapsulated at one time has been reduced in an attempt to reduce the occurrence of voids. However, these methods are only partially successful and are also costly.

SUMMARY

The invention relates to semiconductor packages and the problems encountered during the encapsulation of semiconductor packages in a mold material.

An encapsulated semiconductor package is described herein. The encapsulated semiconductor package includes a substrate with a chip mounting area and inner contact pads on its upper surface and at least two semiconductor chips, each having an active surface with a plurality of chip contact pads and a passive surface. A first semiconductor chip is mounted on the chip mounting area. A spacer block including a first and a second mounting face lying in essentially parallel planes is positioned between and attached to the first semiconductor chip and a second semiconductor chip. The mounting faces of the spacer block have a rounded outline.

The above and still further features of the invention will become apparent upon consideration of the following definitions, descriptions, and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

Embodiments of the invention will now be described with reference to the diagrams.

DETAILED DESCRIPTION

A semiconductor package, according to the invention, includes a substrate which has a chip mounting area and inner contact pads on its upper surface. The package also includes at least two semiconductor chips. Each semiconductor chip has an active surface with integrated circuit devices and a plurality of chip contact pads and a passive surface. A first semiconductor chip is mounted on the chip mounting area of the substrate.

A spacer block which includes a first and a second mounting face lying in essentially parallel planes is positioned between and attached to the first semiconductor chip and a second semiconductor chip. The phrase "essentially parallel" is used here to include small deviations and variations from an exact parallel. The semiconductor packages are attached to the mounting faces of the spacer block. The semiconductor package of the invention, therefore, includes a vertical stack of two semiconductor chips. The semiconductor chip are electrically connected to the inner contact pads of the substrate.

The first and second semiconductor chips, the spacer block, and the electrical connections are encapsulated in mold material. According to the invention, the mounting faces of the spacer block have a rounded outline.

The rounded outline of the mounting faces of the spacer block has the advantage that during the encapsulation process the mold material is believed to be able to flow in an essentially non-turbulent fashion around the spacer block. This improves the coverage of the spacer block and advantageously avoids the formation of voids at the interfaces between the plastic mold material and the spacer block. Preferably, the spacer block includes at last one side surface lying in a plane essentially perpendicular to the mounting faces.

More advantageously, the mounting faces of the spacer block are approximately circular. The spacer block, therefore, has a disc or cylindrical form. This is thought to further improve the flow of the mold material and further reduce the likelihood of void formation.

The spacer block, preferably, comprises electrically non-conductive material or material with a high thermal conductivity. This can improve the thermal properties of the package as heat generated by the semiconductor chips is more efficiently distributed.

The spacer block is, preferably, attached to the semiconductor chips by adhesive means which may comprise an epoxy adhesive or a double-sided adhesive tape. A different adhesive may be used on each mounting face of the spacer block and the semiconductor chips may be detachedly or fixedly attached to the spacer block.

Preferably, the spacer block is laterally smaller than the first and second semiconductor chips. This is particularly advantageous if the spacer block is mounted to the active surface of the semiconductor chip as the spacer block can be mounted in the approximate lateral centre of the active surface. The spacer block, therefore, leaves the chip contact pads, which are positioned towards the periphery of the active surface, freely accessible for the electrical connections.

In one embodiment of the invention, the first and second semiconductor chips have approximately the same lateral size. Alternatively, the second semiconductor chip is laterally larger than the first semiconductor chip or the second semiconductor chip is laterally smaller than the first semiconductor chip. The spacer block of the invention can be advantageously used in a wide variety of types of semiconductor package which include a wide variety of types of semiconductor chips.

The spacer block according to the invention is particularly advantageous for stacked packages where the upper semiconductor chip is larger than the lower semiconductor chip. It has been found that a void free encapsulation of such packages is particularly difficult to achieve reliably.

In an embodiment of the invention, the first lower semiconductor chip is mounted by its passive rear surface to the chip mounting area of the substrate and electrically connected to the inner contact areas positioned on the upper surface of the substrate by bond wires. The chip contact pads are, preferably, positioned towards the periphery of the active surface. In this case, the inner contact areas of the substrate are, preferably, positioned towards the periphery of the substrate and surround an approximately centrally positioned chip mounting area.

The first mounting face of the spacer block is, in this embodiment, attached to the active surface of the first semiconductor chip. The passive surface of the second semiconductor chip is attached to the second mounting face of the spacer block. The active surface of the second semiconductor chip, therefore, faces upwards away from the substrate. The second semiconductor chip is electrically connected to the rewiring substrate by bond wires between the chip contact pads and inner contact areas of the substrate.

Preferably, the substrate comprises an electrically insulating board, such as FR4, BT, and includes an electrically conductive rewiring structure including conductor tracks and vias which connect the inner contact areas on the upper surface of the substrate to outer contact areas positioned on the opposing bottom surface of the substrate. This type of rewiring substrate enables the lateral arrangement, for example the spacing, of the outer contact pads to be different to that of the inner contact pads. A fan-in or fan-out arrangement is possible. This is advantageous as the pattern and spacing of the outer contact pads can be optimized to suit the requirements of the external substrate such as a printed circuit board.

The substrate includes a first plurality of contact areas for the first lower semiconductor chip of the stack and a second plurality of inner contact areas for the second upper semiconductor chip of the stack. The second plurality of inner contact areas lying laterally outside of the first plurality of inner contact areas. If the first semiconductor chip is mounted in the chip mounting area by its passive surface then both pluralities of inner contact areas lie laterally outside of the chip mounting area.

Alternatively, a lead frame type substrate including a chip mounting area surrounded by a plurality of leadfingers provides the substrate. Each leadfinger includes an inner contact pad towards the end of its inner portion. The outer portion of the leadfingers provides the external contact areas of the package.

A method to assemble a semiconductor package includes the following steps. Firstly, a substrate including a chip mounting area and inner contact pads on its upper surface is provided. Additionally, at least two semiconductor chips, each having an active surface with a plurality of integrated circuit devices and a plurality of chip contact pads and a passive surface are provided.

A spacer block including a first and a second mounting face, the first and second mounting faces lying in two essentially parallel planes, is provided. The first and second mounting faces of the spacer block have a rounded outline.

A first semiconductor chip is positioned on the chip mounting area of the substrate. The first mounting face of the spacer block then is positioned on the first semiconductor chip and a second semiconductor chip on the second mounting face of the spacer block. The first and second semiconductor chips and the spacer block are encapsulated in mold material. The mold or encapsulation material flows in an essentially non-turbulent fashion around the spacer block due to the rounded mounting faces of the spacer block. The mold material is then given an appropriate curing treatment.

The spacer block is attached to the semiconductor chips by adhesive means. The adhesive can be placed on the semiconductor chips or alternatively on the mounting faces of the spacer block. The adhesive means is given an appropriate curing treatment if this is required.

The electrical connections between the first semiconductor chip and the substrate may be made after the chip is mounted on the substrate. The spacer block is then attached to the first semiconductor chip, the second semiconductor chip mounted on the spacer block and the electrical connections between the second semiconductor chip and the substrate made during a second process step. This method is advantageous if the type of electrical connection is different. This method is also convenient if the lower semiconductor chip is electrically connected by bond wires to the substrate as the chip contact areas of the lower chip are more easily accessible before the spacer block is attached.

Alternatively, the vertical stack of the two semiconductor chips and spacer block can be formed and the electrical connections to both chip provided in the same process step. This reduces the number of process steps and increases the simplicity of the process line, thus reducing manufacturing costs.

In one embodiment of the invention, the first semiconductor chip is mounted by its passive rear surface to the substrate by adhesive means, such as die attach material and electrically connected to the substrate by bond wires which extend between the chip contact pads and inner contact areas of the substrate. Known bonding techniques are advantageously used so as to minimize manufacturing costs.

The first mounting face of the spacer block is, in this case, attached to the active surface of the first semiconductor chip by adhesive and passive surface of the second semiconductor chip attached to the second mounting face of the spacer block is by adhesive. The second semiconductor chip is electrically connected to the substrate by bond wires extending between the chip contact pads and inner contact areas.

The semiconductor package is, preferably, encapsulated by placing a plurality of packages in a mold and injecting the encapsulation material into the mold from one side of the mold. Advantageously, several stacks comprising two semiconductor chips connected together by a spacer block are assembled on a single common substrate which includes a plurality of package positions, typically arranged in rows and columns. This simplifies the assembly process and encapsulation process. A panel is, therefore, formed including several packages embedded in a single plastic mold mass. The individual packages are then separated from the panel by, for example, sawing.

The spacer block is fabricated by providing a long strip of the material of the spacer block. The strip is, preferably, laminated between a base tape and a cover tape comprising a plastic. The base and cover tapes can be easily removed from the strip material and provide protection from dirt and dust for the spacer block material. Each spacer block formed by cutting or stamping the block from the strip. This method has the advantage that the cost of the initial material supply is reduced.

Alternatively, a plurality of spacer blocks is provided in the form of a continuous strip with a plurality of at least partially pre-cut spacer blocks positioned at intervals along the length of the strip. This has the advantage that the spacer blocks are simply removed from the strip during the package assembly process by a pressing operation.

It has been observed that voids are more likely to be formed at the side faces of the package and in particular of the spacer block facing away from the direction of flow increasing the potential for air entrapment. This problem has been observed to increase as the distance between the inlet point and the package position increases. For instance, in a mold including 3 rows of packages, it has been observed that the voids are most likely to occur in the $3^{rd}$ row furthest from the inlet points or mold gates.

It is believed that in conventional packages which include a cubic spacer block, the side face of the spacer block which is perpendicular to the direction of flow of the mold material together with the 90° angles causes a large disturbance to the flow front of the mold mass through the mold. This causes the mold material to flow more rapidly in the areas between the stacked semiconductor chips and hinders the flow of the mold material at the package positions. This results in a highly non-planar flow front.

In order to encapsulate the side of the package facing away from the flow direction, the mold mass flows round the package and two flow front merge. It is believed that the 90° angles provide a larger distance between the two merging flow fronts which increases the likelihood of air entrapment and void formation.

The stacked semiconductor package of the invention including a spacer block in which the mounting faces of the spacer block have a rounded outline has the following advantages over the prior art packages. The spacer block of the invention avoids the presence of 90° angles between adjacent side walls of the spacer block and, therefore, avoids a side face which lies perpendicular to the direction of flow of the mold material.

The rounded side face of the spacer block of the invention is believed to allow the mold material to flow in a non-turbulent manner along the rounded side face and completely cover the side face of the spacer block. Thus the entrapment of air and formation of voids is avoided.

The rounded side face of the spacer block of the invention also allows the process window of the spacer attachment to be widened. In the embodiment of the invention, in which the spacer block is symmetrical as it has a cylinder form, the process window of the spacer attachment is further widened. Thus, the spacer block of the invention provides an additional advantage over the prior art packages.

Exemplary embodiments of the invention are now described in connection with the drawings.

Figure 1:
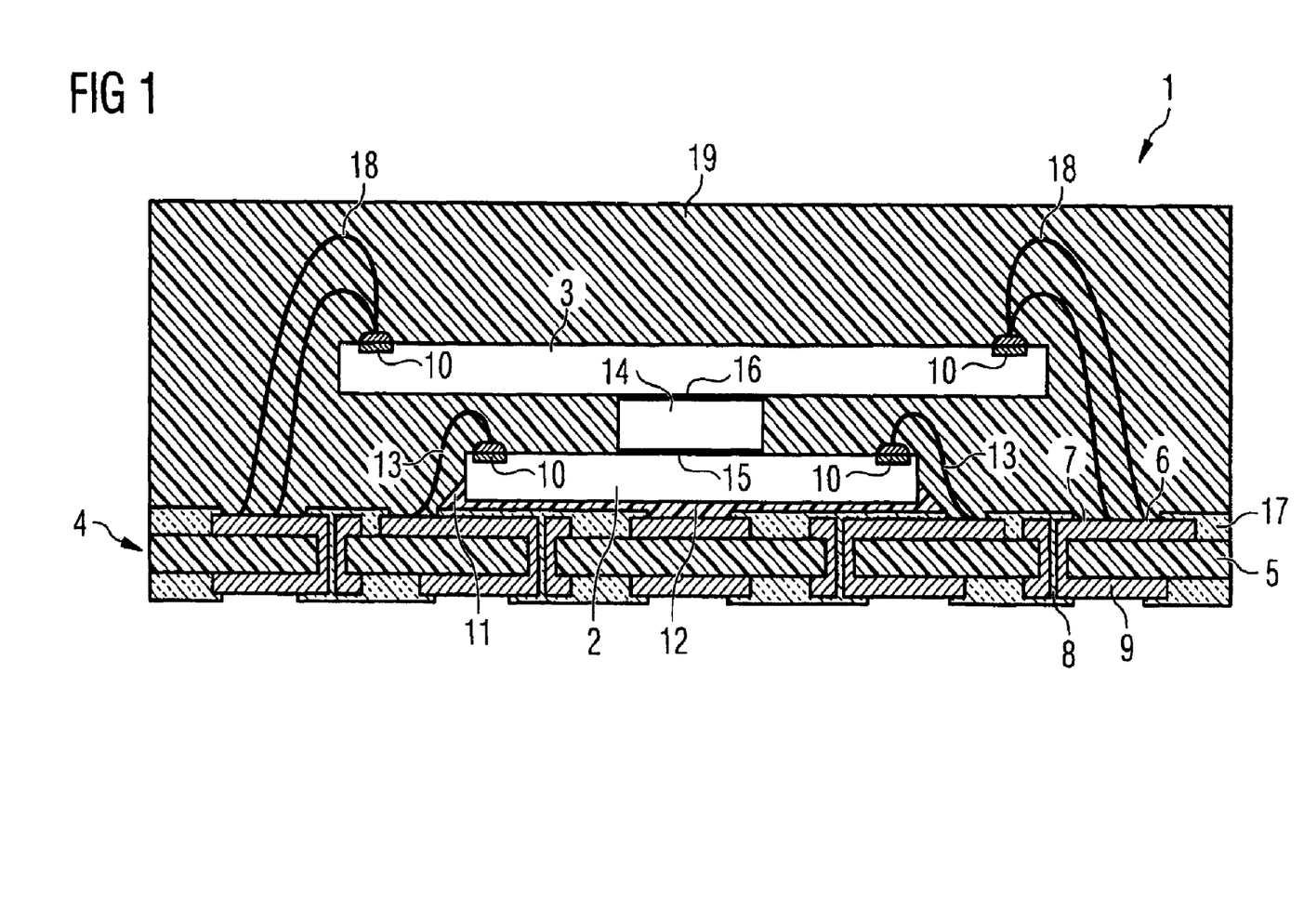
FIG. 1 shows a semiconductor package including two stacked semiconductor chips.

As shown in FIG. 1, a semiconductor package 1 according to the invention includes two stacked semiconductor chips 2, 3 and a rewiring substrate 4. The rewiring substrate 4 includes an electrically insulating body 5 comprising a FR4 board. A plurality of inner contact pads 6 are positioned on the upper surface of the rewiring substrate 4. The rewiring substrate 4 also includes a chip mounting area 12 in approximately the lateral center of the top surface. The inner contact areas 6 lie laterally outside and laterally surround the central chip mounting area 12.

Each of the plurality of inner contact pads 6 is electrically connected by a conductor track 7 and via 8 to an outer contact area 9 positioned on the opposing bottom surface of the insulating board 5. The inner contact pads 6, conductor tracks 7, vias 8, and outer contact areas 9 provide the electrically conducting rewiring structure of the semiconductor package 1. The upper and lower surfaces of the rewiring substrate 4 also include a solder resist layer 17 which covers both the upper and lower surfaces leaving free the inner contact areas 6 and the outer contact areas 9.

A semiconductor chip 2 includes an active surface with a plurality of integrated circuit devices and a plurality of chip contact areas 10. The chip contact areas 10 are located towards the periphery of the active surface of the semiconductor chip 2. The semiconductor chip 2 is mounted on the chip mounting area 12 by its passive rear surface and is attached to the upper surface of the rewiring substrate 4 by die attach material 11. The inner contact areas 6 of the rewiring substrate, therefore, laterally surround the semiconductor chip 2. The chip contact areas 10 of the semiconductor chip 2 are electrically connected to the inner contact areas 6 of the rewiring substrate 4 by bond wires 13.

A disc spacer 14 is positioned on the active surface of the semiconductor chip 2 in approximately the lateral center of the semiconductor chip 2. The disc spacer 14 is attached by a thin layer of adhesive 15 to the active surface of the semiconductor chip 2. According to the invention, the disc spacer 14 has an approximately circular lateral cross-section, which is not visible in the cross-sectional view of the semiconductor package 1 shown in FIG. 1, but can be seen in the exploded perspective view of FIG. 2. The disc spacer 14 has, therefore, a cylindrical form.

The disc spacer 14 is laterally smaller than the semiconductor chip 2 and is laterally smaller than the distance between the chip contact pads 10 so that it is positioned on the active surface of the semiconductor chip 2 within the chip contact pads 10. The disc spacer 14 has a height which is slightly greater than the distance by which in the bond wires 13 extend above the active surface of the semiconductor chip 2.

A second semiconductor chip 3 which is laterally larger than the semiconductor chip 2 is mounted by its passive rear face to the upper surface of the disc spacer 14 by a thin layer of adhesive 16. The semiconductor chip 3 is mounted in approximately its lateral center to the disc spacer 14 so that the peripheral regions of the semiconductor chip 3 are positioned above the bond wires 13 which connect the semiconductor chip 2 to the rewiring substrate 4. The passive surface of the semiconductor chip 3 is, therefore, not in contact with the bond wires 13. The semiconductor chip 3 also includes chip contact areas 10 on its upper active surface towards the periphery of the chip. The contact areas 10 of the semiconductor chip 3 are connected by bond wires 18 to inner contact areas 6 positioned on the upper surface of the rewiring board 4.

The semiconductor chips 2, 3 are, therefore, vertically stacked approximately concentrically. The semiconductor chips 2, 3 disc spacer 14 and bond wires 13, 18 are embedded by a plastic mould material 19 to provide the encapsulated semiconductor package 1.

Figure 2:
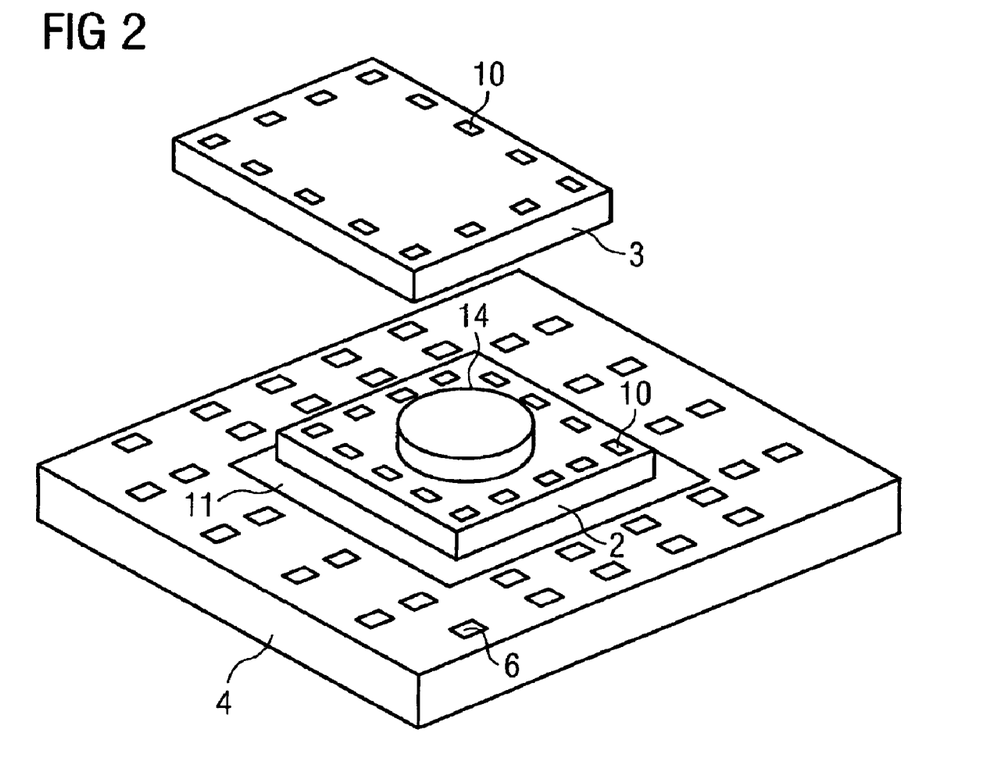
FIG. 2 shows a schematic diagram of an exploded perspective view of the arrangement of the package of FIG. 1.

FIG. 2 shows a schematic diagram of an exploded perspective view of the semiconductor package 1 of FIG. 1, in which the arrangement of the two semiconductor chips 2, 3 and shape of the disc spacer 14 can be seen. The same reference numbers are used in all of the figures to denote the same features.

From FIG. 2, it can be seen that the inner contact areas 6 of the rewiring substrate 4 are arranged in two rows around the periphery of the substrate 4. The chip contact pads 10 are arranged in a single row around the periphery of each semiconductor chip 2, 3. The semiconductor chip 2 is mounted on the rewiring substrate 4 within the inner contact areas 6 and attached to the chip mounting area 12 by die attach material 11.

The disc spacer 14 is laterally approximately circular and laterally smaller than the distance between the chip contact pads 10 of the semiconductor chip 2. The disc spacer 14 is mounted in approximately the center of the active surface of the semiconductor chip 2.

Figure 3:
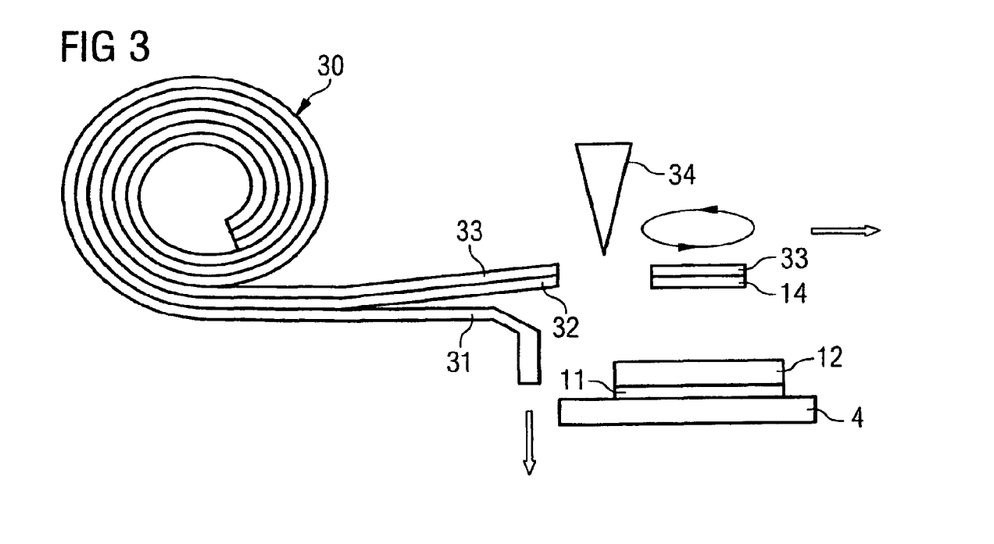
FIG. 3 illustrates a step in a method to assemble the semiconductor package 1 of FIG. 1.

FIG. 3 shows a step in a method to assemble the semiconductor package 1. The passive rear surface of the semiconductor chip 2 is attached to the rewiring substrate 4 by die attach material 11. A spool 30 is provided which includes a long coil of the material 32 to form the disc spacer 14 in strip from. The strip 32 is laminated between a base carrier tape 31 and a cover tape 33 which comprise a plastic. The base carrier tape 31 is peeled away and a disc spacer 14 including a layer of the cover tape 33 is cut by a cutting tool 34 from the continuous strip 32.

Figure 4:
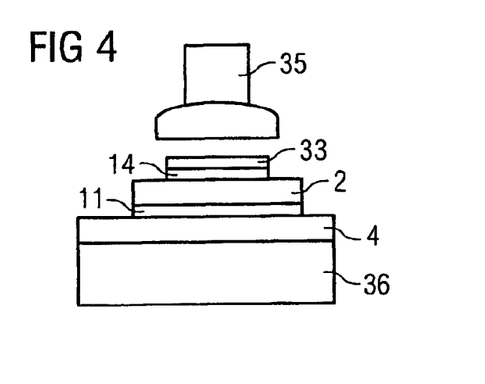
FIG. 4 shows the attachment of the disc spacer to the first semiconductor chip of FIG. 3.

FIG. 4 shows the next stage in the process whereby the disc spacer 14 is mounted on the active surface of the semiconductor chip 2 and attached by pressing the disc 14 and chip 2 together with a pressing tool 35 by applying a pressure at a certain temperature for a particular time. The conditions depend on the material used and, for example, by applying a pressure of 0.1 to 0.5 MPa with the pressing tool 35 and heating at 50° C. to 120° C. for 1 second by heater 36.

Figure 5:
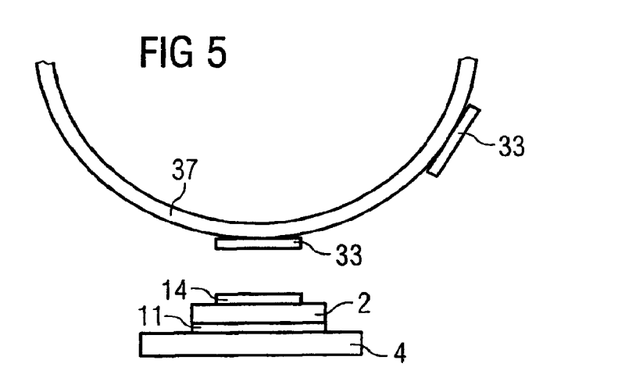
FIG. 5 depicts the removal of the cover tape from the disc spacer of FIG. 4.

FIG. 5 shows the removal of the cover film 33 from the disc spacer 14 by the use of an adhesive peeling tape 37. The adhesion of the cover film 33 to the adhesive peeling film 37 is greater than that of the cover film 33 to the disc spacer 14. This enables the cover film to be easily removed from the spacer block.

Figure 6:
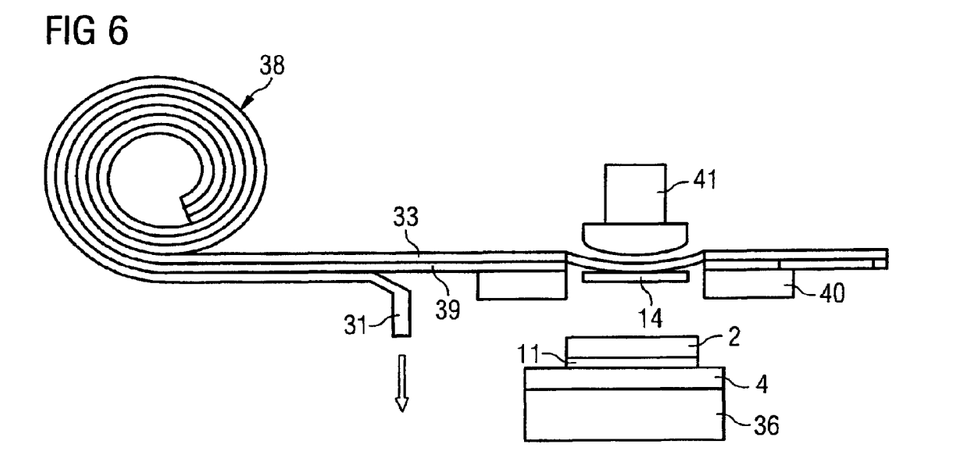
FIG. 6 shows a step in an alternative method to assemble the semiconductor package of FIG. 1.

FIG. 6 shows an alternative method by which the disc spacers 14 are fabricated and placed on the semiconductor chip 2. In this method, a spool 38 is provided in which the disc spacers 14 are provided in a pre-cut strip 39 which is laminated between a base carrier tape 31 and cover tape 33. The pre-cut strip 39 includes a plurality of disc spacers 14 longitudinally arranged at intervals along the length of the strip 39. The disc spacers 14 are at least partially severed from the strip 39.

The strip 39 passes over an annular support structure 40 which includes an opening laterally larger than the lateral size of the disc spacer 14. A pressing head 41 is brought down into contact with the cover tape 33 and pre-cut disc spacer 14 and presses the disc spacer 14 separating it from the carrier tape 39. The disc spacer 14 is pressed onto the surface of the semiconductor chip 2 which is already mounted on the rewiring substrate 4. The disc spacer 14 is attached to the semiconductor chip 2 using the same conditions as previously described.

Figure 7:
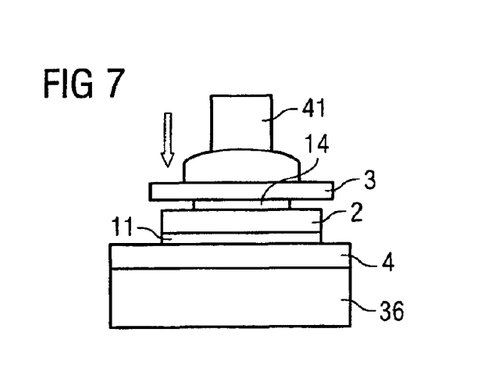
FIG. 7 illustrates the attachment of a second semiconductor chip to the intermediate stack of FIGS. 5 or 6.

FIG. 7 shows the formation of a semiconductor chip stack of the semiconductor package 1 in which the upper semiconductor chip 3 is attached to the disc spacer 14 by is passive surface. The upper semiconductor chip 3 is mounted to the upper surface of the disc spacer 14, for example, under a pressure of 0.1 to 0.5 MPa at a temperature between 120° C. to 180° C. for 1 to 2 seconds. The conditions used in the attachment process depend on the material used.

The semiconductor chips 2, 3 are then electrically connected to the rewiring substrate 4 by a wiring bonding process and the stack of semiconductor chips and bond wires encapsulated in a plastic mold material.

Figure 8:
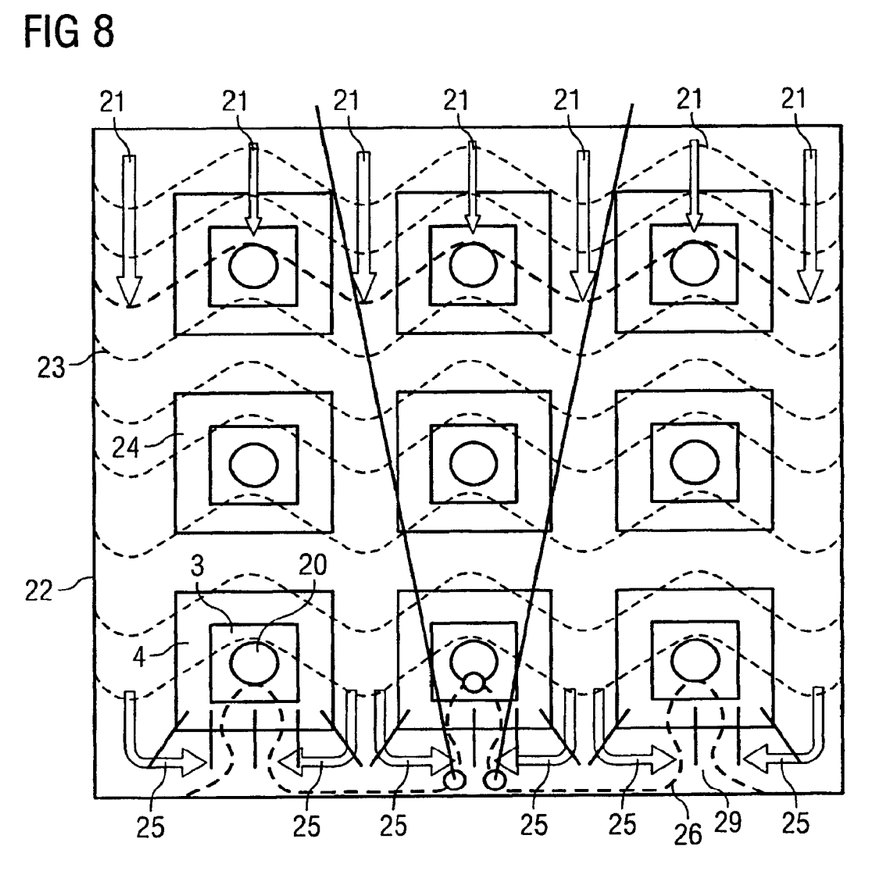
FIG. 8 shows a schematic diagram of a top view of the encapsulation of nine semiconductor packages.

FIG. 8 shows a schematic diagram of the top view of the encapsulation of nine semiconductor packages 1 which are essentially the same. Nine package positions 24, each for a semiconductor package 1, are arranged in a three by three grid array in the mold 22. Each semiconductor package 1 is depicted by an indication of the position of the substrate 4 and upper semiconductor chip 3. The position of the circular disc spacer 14 is also indicated by circle 20.

The arrows 21 towards the top of FIG. 8 indicate the entrance of the encapsulation material into the mold 22 through the mold gates (which are not indicated in the figure) and indicate the direction of the flow of the mold mass. The series of undulating dotted lines 23 indicate the presumed flow front of the encapsulation material 19 in the mold in the direction 21 and show that the material is expected to flow more easily between the package positions 24. The flow front has an undulating form. When the flow front 23 reaches the third row of semiconductor packages 1 which lie furthest from the inlet mold gates, the flow front moves behind each of the last row of packages from two opposing sides as shown by the arrows 25 so as to essentially fill the mold 22. This creates a pinch interface when the two flow-fronts merge as indicated by the dashed line 26.

Figure 9:
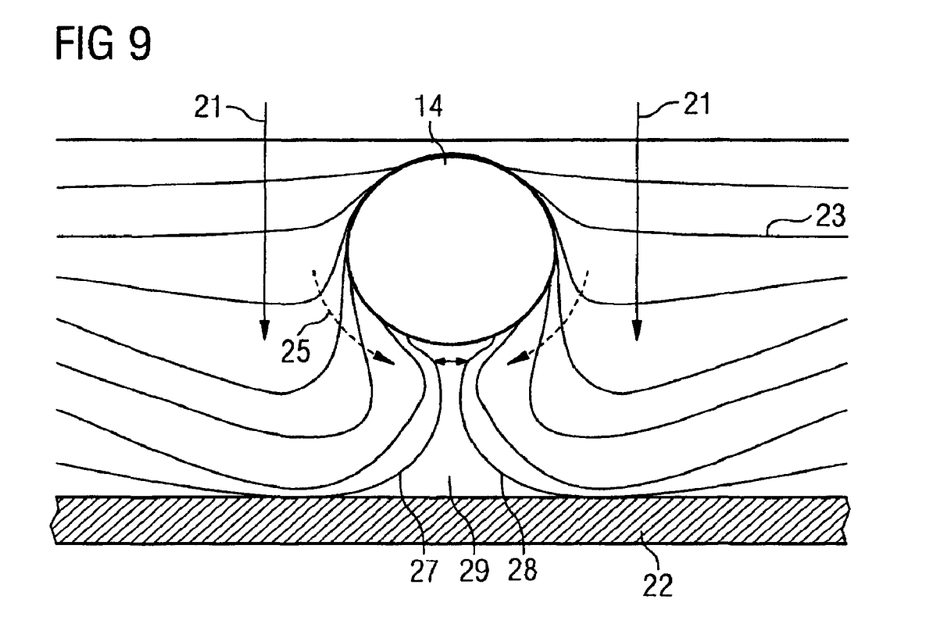
FIG. 9 shows a schematic diagram of a detail of the presumed flow front profile for a single package position.

FIG. 9 shows a schematic diagram of a detail of the presumed flow front profile for a single semiconductor position 24 in the third row furthest from the mold inlet gates. For clarity, only the position of the disc spacer 14 is shown.

The arrows 21 indicate the direction of flow from the mold gate inlets which are not shown in the diagram. The undulating lines 23 indicate the presumed path of the flow front. As indicated by the arrows 25 the flow front is expected to advance more readily to the left and right (as depicted in the diagram) of the disc spacer 14 and then flow behind the disc spacer where two flow fronts 27 and 28 meet and the mold 22 is filled. As can be seen from FIG. 9, the circular shape of the disc spacer 14 is believed to enable a non-turbulent flow of the mold material 19 around the disc spacer 14 which results in an improved encapsulation since the formation of voids in the pinch area 29 is avoided.

A panel including nine encapsulated semiconductor packages 1 is, therefore, formed. The plastic mold material is then given an appropriate curing treatment. The individual packages are separated from the panel by sawing and external contacts such as solder balls are attached to the outer contact areas of the rewiring substrate. This enables the package to be mounted on and electrically connected to an external substrate such as a printed circuit board.

While the invention has been described in detail with reference to specific embodiments thereof, it will be apparent to those skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A method for assembling an electronic package, comprising:
    mounting a first semiconductor chip on a chip mounting area on an upper surface of a substrate;
    providing a continuous strip of material laminated between a base carrier tape and a cover tape;
    removing the base carrier tape from the continuous strip of material;
    separating a portion of the continuous strip of material to form a spacer block with first and second mounting faces lying in approximately parallel planes and having a rounded outline, wherein the spacer block is cut or stamped from the continuous strip;
    mounting the first mounting face of the spacer block on the first semiconductor chip by simultaneously applying pressure and heat;
    removing the cover tape from the second mounting face of the spacer block;
    mounting a second semiconductor chip on the second mounting face of the spacer block by simultaneously applying pressure and heat;
    encapsulating the first and second semiconductor chips and the spacer block in mold material by placing a plurality of packages in a mold and injecting the mold material into the mold from one side of the mold such that the mold material flows around the spacer block in an essentially non-turbulent fashion; and
    curing the mold material.

2. The method according to claim 1, wherein the first semiconductor chip includes an active surface with a plurality of chip contact pads and a passive surface, the first semiconductor chip being mounted by its passive surface to the substrate, the method further comprising electrically connecting the first semiconductor chip to the substrate by bond wires.

3. The method according to claim 2, wherein the second semiconductor chip has an active surface with a plurality of chip contact pads and a passive surface, and wherein the first mounting face of the spacer block is attached to the active surface of the first semiconductor chip by adhesive, the second mounting face of the spacer block is attached to the passive surface of the second semiconductor chip by adhesive, and the second semiconductor chip is electrically connected to the substrate by bond wires.

4. The method according to claim 1, wherein the continuous strip is formed with a plurality of at least partially pre-cut spacer blocks longitudinally arranged at intervals along the length of the continuous strip.

5. The method of claim 4, wherein the spacer block is one of the at least partially pre-cut spacer blocks and is separated from the continuous strip of material by stamping.

6. The method of claim 5, wherein the cover tape is removed from the second mounting face of the spacer block prior to mounting the spacer block on the first semiconductor chip.

7. The method of claim 1, wherein the spacer block is removed from the continuous strip of material by cutting.

8. The method of claim 7, wherein the cover film is removed from the spacer block by adhering the cover film to an adhesive peeling tape and moving the adhesive peeling tape relative to the spacer block.

9. The method of claim 1, wherein the spacer block is mounted on the first semiconductor chip by applying a pressure of 0.1 to 0.5 MPa and heating at 50° C. to 120° C. for at least one second.

10. The method of claim 1, wherein the second semiconductor chip is mounted on the second mounting face of the spacer block under a pressure of 0.1 to 0.5 MPa at a temperature between 120° C. to 180° C. for 1 to 2 seconds.

11. The method of claim 1, further comprising:
    arranging a plurality of semiconductor chip stacks in rows and columns, each of the semiconductor chip stacks comprising first and second semiconductor chips separated by a spacer, wherein the semiconductor chip stacks are encapsulated in the mold material.

* * * * *